(12) United States Patent
Hsu et al.

(10) Patent No.: US 6,441,443 B1
(45) Date of Patent: Aug. 27, 2002

(54) EMBEDDED TYPE FLASH MEMORY STRUCTURE AND METHOD FOR OPERATING THE SAME

(75) Inventors: Ching-Hsiang Hsu; Ching-Sung Yang, both of Hsin-Chu (TW)

(73) Assignee: Ememory Technology Inc., Hsin-Chu (TW)

( * ) Notice: Subject to any disclaimer, the term of this patent is extended or adjusted under 35 U.S.C. 154(b) by 0 days.

(21) Appl. No.: 09/781,430

(22) Filed: Feb. 13, 2001

(51) Int. Cl.[7] .............................................. H01L 29/76
(52) U.S. Cl. ................... 257/371; 257/315; 365/185.18
(58) Field of Search ......................... 257/315; 438/201, 438/211, 257; 365/185.01, 185.11, 185.18

(56) References Cited

U.S. PATENT DOCUMENTS

| | | | | |
|---|---|---|---|---|
| 5,677,215 A | * | 10/1997 | Goo ............................ 437/43 |
| 5,751,631 A | * | 5/1998 | Liu et al. ................ 365/185.01 |
| 5,956,271 A | * | 9/1999 | Kaya ...................... 365/185.18 |
| 5,999,443 A | * | 12/1999 | Ling et al. .............. 365/185.01 |
| 6,091,101 A | * | 7/2000 | Wang .......................... 257/315 |
| 6,232,183 B1 | * | 5/2001 | Chen et al. .................. 438/264 |
| 6,262,914 B1 | * | 7/2001 | Smayling et al. ....... 365/185.11 |

* cited by examiner

Primary Examiner—David Nelms
Assistant Examiner—Tu-Tu Ho

(57) ABSTRACT

The present invention provides an embedded type flash memory structure and a method for operating the same. The memory structure of the present invention comprises a first deep doped-region formed on the surface of a semiconductor substrate. A second doped-region is implanted in the first deep doped-region. A plurality of first shallow doped-regions are respectively formed in the second doped-region and the first deep doped-region to be used as drains and sources. A dielectric insulating layer and a poly-silicon gate are stacked above the first deep doped-region between the source and the drain. The present invention also proposes programming, erasing, and reading processes corresponding to the flash memory cell structure.

7 Claims, 5 Drawing Sheets

EMBEDDED TYPE FLASH MEMORY STRUCTURE AND METHOD FOR OPERATING THE SAME

FIELD OF THE INVENTION

The present invention relates to a non-volatile memory structure and, more particularly, to a flash memory structure having the characteristics of low operational voltage and high density and a method for operating the same.

BACKGROUND OF THE INVENTION

Flash memories have been widely used in small electronic products such as notebook computers or digital cameras. Moreover, along with the trend of miniaturization of electronic products, the sizes of flash memories need to be smaller and smaller. However, when small-size flash memories are manufactured by means of sub-micrometer fabrication technology, the transistors of memory cells in the memory cell array must be operated at a small voltage about 3V because of short channel effects.

FIG. 1 shows a memory cell structure of a prior art flash memory. N-type doped-regions used as a source 12 and a drain 14 are formed in a p-type semiconductor substrate 10, and a channel is formed in the substrate 10 between the source 12 and drain 14. A silicon dioxide layer 16, a trapping layer 18 (e.g., silicon nitride), and a silicon dioxide layer 20 are formed in turn on the surface of the substrate 10. A control gate 22 is then formed on the surface of the silicon dioxide layer 20. When a programming process is performed to the memory cell, a sufficiently large voltage must be applied to the drain and the source so that the above action can be accomplished by means of the channel formed by this high voltage difference. Therefore, the operational voltage of a prior art flash memory cannot be easily reduced so that the operational voltage is too high. Moreover, the structure of the memory cell array is required to be denser and denser so that the channel length is reduced therewith, resulting in mutual influence of operation between each memory cell. If the operational voltage cannot be relatively reduced, short channel effects will arise so that the phenomenon of punch through will occur. Furthermore, because complex design of peripheral circuits is required for higher operational voltages, the above high-voltage operational method will complicate the design of peripheral circuits.

The simplest way to resolve the above short channel effects is to reduce the operational voltage or to change the operational mode to facilitate the miniaturization of memory cell. Accordingly, the present invention proposes an improved structure of flash memory cell and a method for operating the same to resolve the above problems in the prior art.

SUMMARY OF THE INVENTION

The primary object of the present invention is to provide an improved structure of flash memory cell and a method for operating the same. A shallow doped-region is added below the doped-region used as the drain. Using these two different doped-regions to share the voltage, the voltage can be controlled and the operational voltage of the memory cell can be reduced. Moreover, the design of peripheral circuits will be simpler.

Another object of the present invention is to provide an embedded type flash memory structure having the characteristics of low operational voltage and high density and a method for operating the same.

According to the present invention, an n-well is formed in a p-type substrate. A shallow p-well is formed in the n-well, and a drain and a source of shallower n-type doped-regions are formed in the shallow p-well and the n-well, respectively. A dielectric insulating layer and a poly-silicon gate are stacked above the n-well to connect all the drains.

The various objects and advantages of the present invention will be more readily understood from the following detailed description when read in conjunction with the appended drawings, in which:

DETAILED DESCRIPTION OF THE PREFERRED EMBODIMENTS

The present invention is characterized in that a second doped-region is added to share the voltage of a first shallow doped-region used as a drain to reduce the operational voltage of the memory cell so that both the effects of low operational voltage and high density can be achieved.

Figure 1:
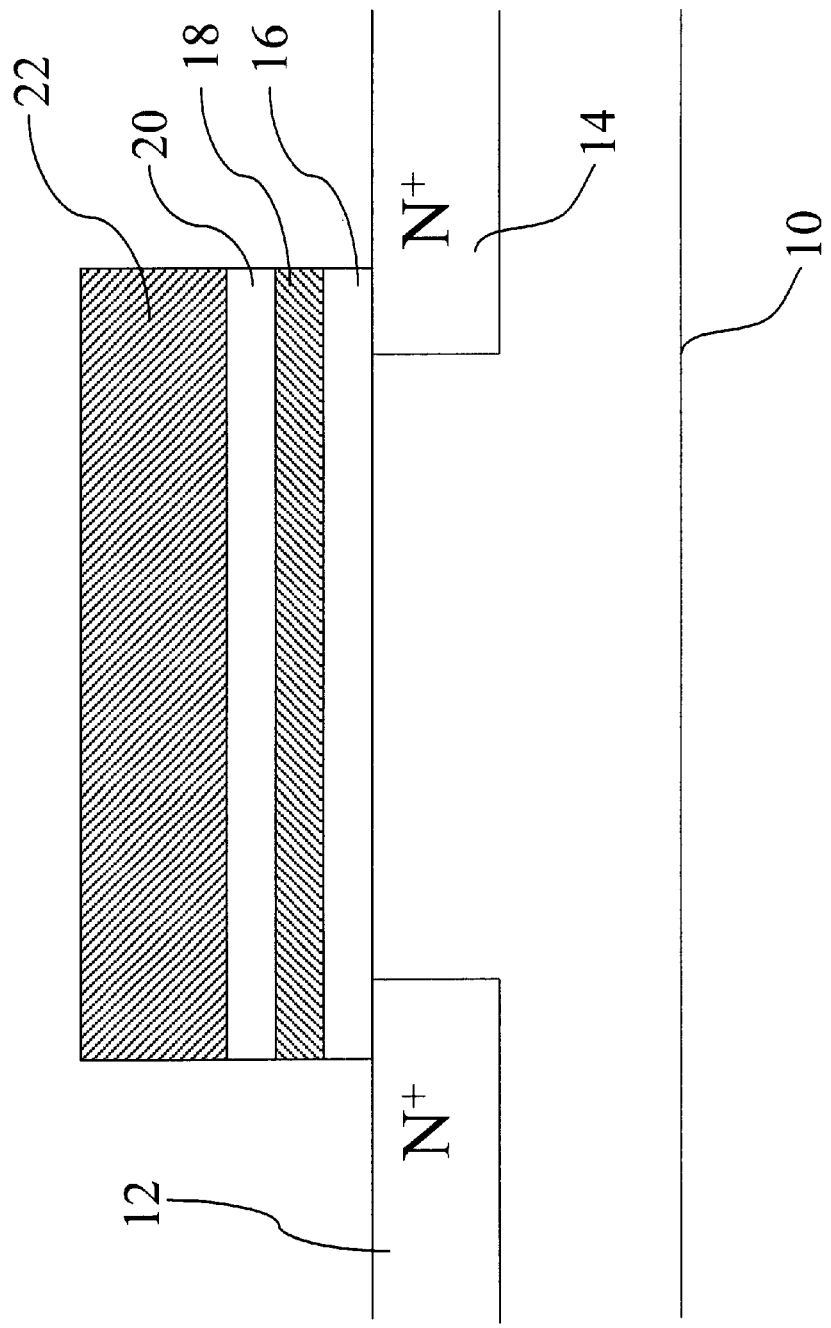
FIG. 1 is a diagram of the memory cell structure of a prior art flash memory.
Figure 2:
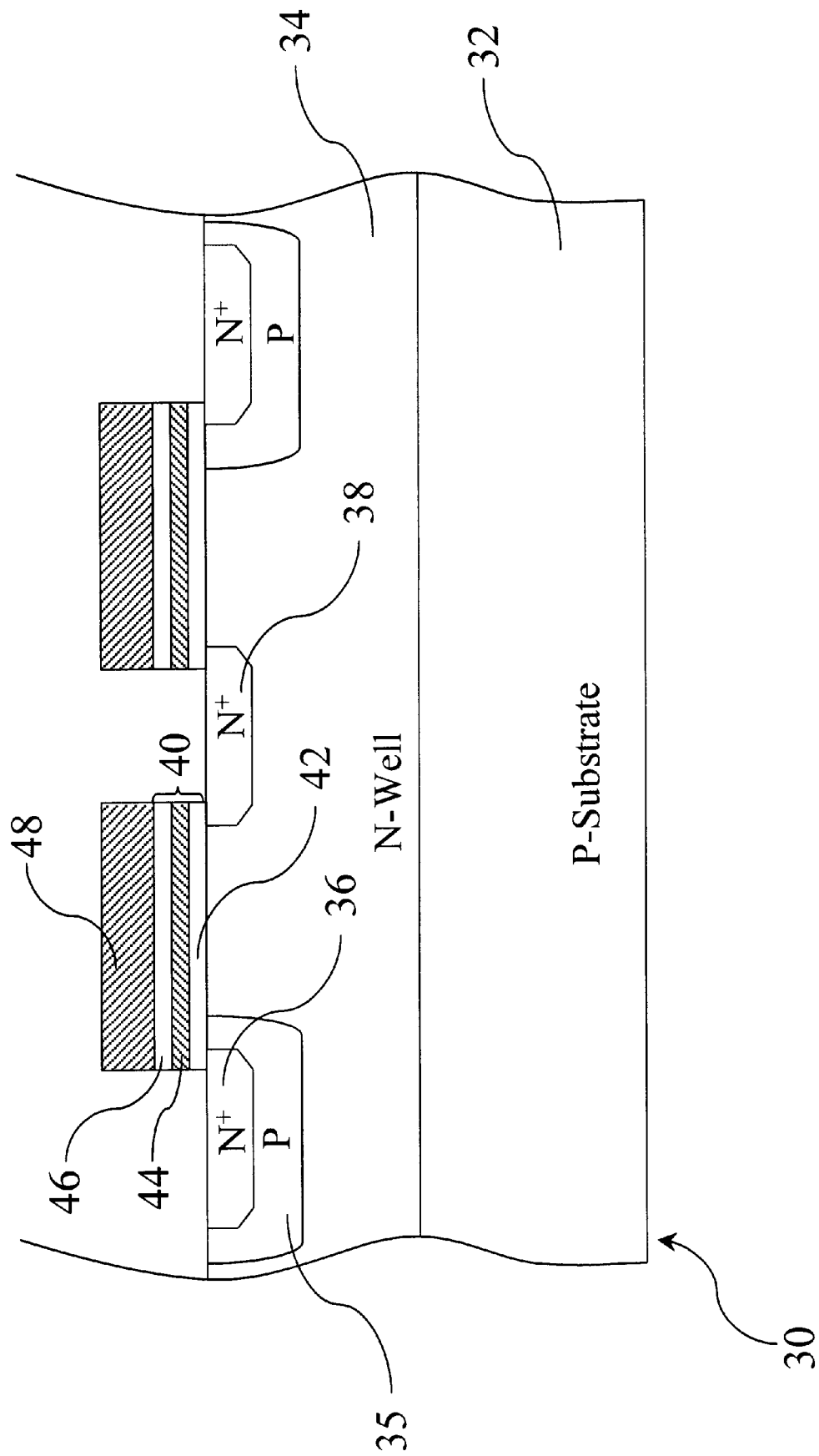
FIG. 2 is a diagram of the flash memory cell structure of the present invention.

A flash memory cell structure is shown in FIG. 2. A first deep (i.e., large ion penetration depth) doped-region 34 is formed in a p-type semiconductor substrate 32 by means of ion implantation as an n-well. A second doped-region 35 is formed in the n-well as a shallow (i.e., much smaller ion penetration depth than that of the first deep doped-region) p-well. N-type ions are implanted both in the surfaces of the n-well 34 and the shallow p-well 35 to form a plurality of first shallow doped-regions. The first shallow doped-region in the n-well 34 is used as a source 38 while the first shallow doped-region in the shallow p-well 35 is used as a drain 36. The doping depth of the n-well 34 is much thicker than that of the first shallow doped-region used as the drain 36. A dielectric insulating layer 40 is stacked on the surfaces of the n-well 34 and the shallow p-well 35 between the drain 36 and the source 38. The dielectric insulating layer 40 comprises, in ascending order from the lowest layer of the stack, a silicon oxide layer 42, a trapping layer 44 (usually being silicon nitride), and a silicon oxide layer 46. The dielectric insulating layer 40 is thus called an oxide-nitride-oxide film, briefly termed an ONO film. A gate 48 such as highly doped poly-silicon is formed between drain 36 and source 38 and is used to connect all the drains 36. Because of the functions of the n-type drain 36 and the shallow p-well 35 thereunder, the original higher voltage in the prior art drain is split into two parts so that the operational voltage can be effectively reduced. The operational voltage will be clearly described below.

Figure 3:
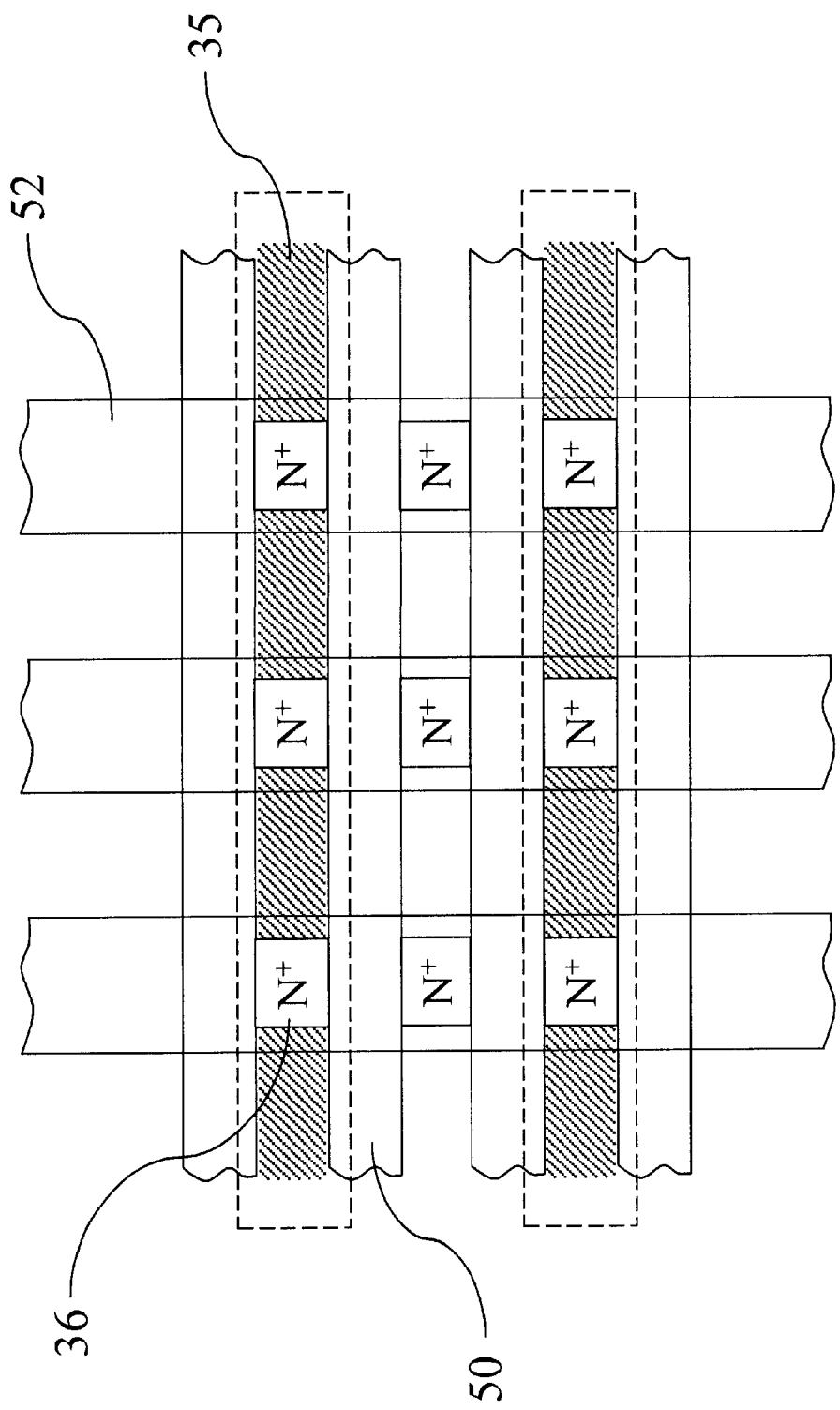
FIG. 3 is a diagram of the memory array of the present invention.

Please also refer to FIG. 3. The poly-silicon gate 48 of the flash memory cell 30 forms a word line 50, and the drain 36 forms a bit line 52. A shallow p-well 35 is implanted below the n-type drain 36 between every two adjacent word lines 50. Every two word lines 50 share a shallow p-well 35. The object of reducing the operational voltage is accomplished by individually applying voltages to the shallow p-well 35 and the bit line 52.

The above trapping layer 42 in the dielectric insulating layer 40 is used as a charge-storing region for accepting and keeping electrons or holes injected into the dielectric insulating layer 40 so as to perform the programming or erasing process.

The operational method corresponding to the flash memory cell structure of the present invention will be illustrated below. Please refer to FIGS. 2 and 3 simultaneously. A source line voltage $V_S$, a bit line voltage $V_{BL}$, and a word line voltage $V_{WL}$ are applied to the source 38, the drain 36, and the gate 48 of the flash memory cell 30, respectively. A shallow p-well voltage $V_{PW}$ is also applied to the shallow p-well 35 to facilitate the operations of programming, erasing, and reading of the memory cell 30.

Figures 4A, 4B:
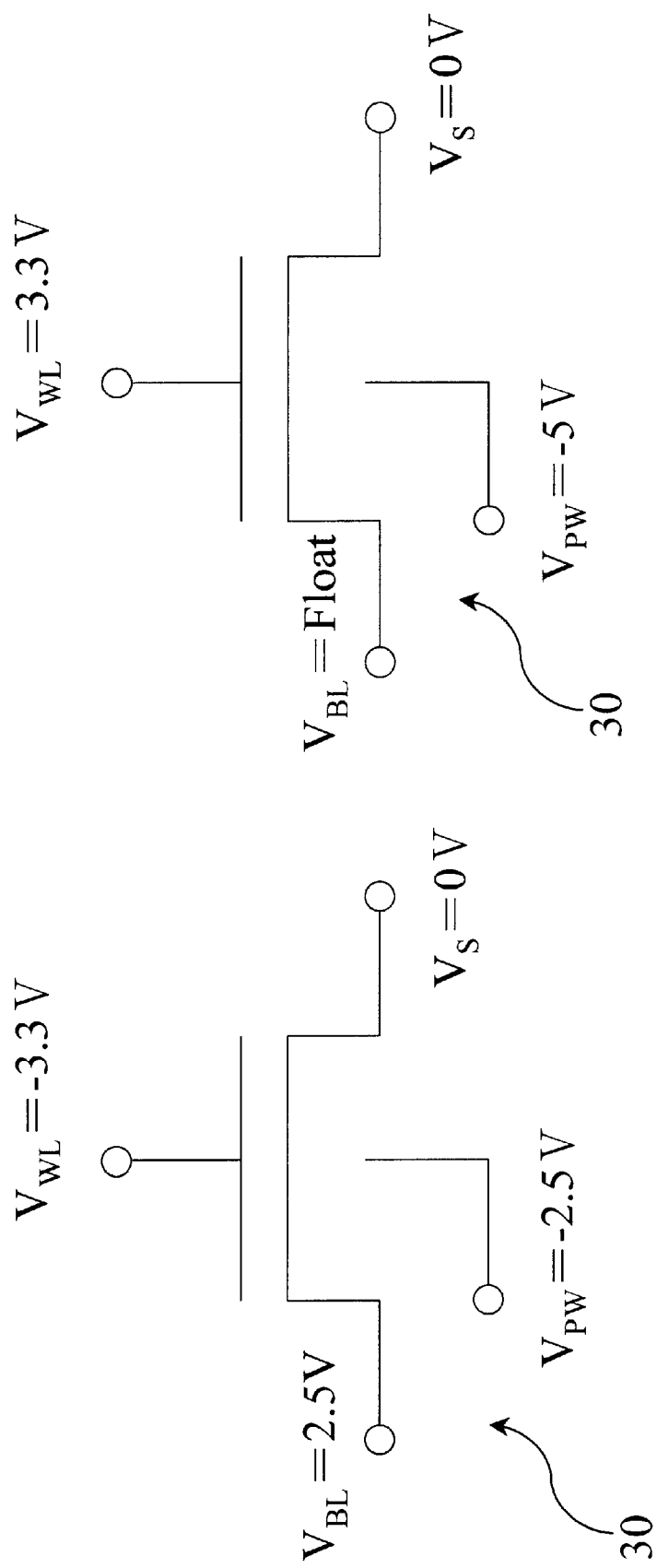
FIGS. 4(A), 4(B), and 4(C) show the programming process, the erasing process, and the reading process according to an embodiment of the present invention, respectively.

FIG. 4(A) shows a programming process of the flash memory cell 30. A positive bit line voltage $V_{BL}$ about 2~5V, e.g., $V_{BL}$–2.5V, is applied to the drain 36. The source line voltage is a ground state ($V_S$=0). A sufficiently large negative voltage about –2~–5V, e.g., $V_{PW}$=–2.5V, is applied to the p-well 35. A negative word line voltage about –2~–7V, e.g., $V_{WL}$=–3.3V, is also exploited to generate a sufficiently large band-to-band tunneling (BTBT) current between the interfaces of the gate 48 and the drain 36 and the shallow p-well 35 so that induced thermal holes will pass through the silicon oxide layer 42 to let the holes be trapped in the charge-storing region of the trapping layer 44. Thereby, the charge status after the programming process can be stored to achieve the function of programming.

FIG. 4(B) shows an erasing process of the flash memory cell 30. The bit line voltage $V_{BL}$ is a floating state. The source line voltage is a ground state ($V_S$=0). The word line voltage $V_{WL}$ is a sufficiently large positive voltage about 2~5V, e.g., $V_{WL}$=3.3V. Thereby, a device channel will be formed. A negative voltage about –3~–7V, e.g., $V_{PW}$=–5V, is applied to the p-well. This sufficiently large negative voltage and the 0V of the drain and the channel are exploited so that a sufficiently large BTBT current can be generated in the channel region. Part of hot electrons will be attracted by the sufficiently large vertical electric field of the word line voltage $V_{WL}$ to pass the energy barrier of the silicon oxide layer 42 and reach the trapping layer 44 to be trapped in the same charge-storing region as that in the above programming process of the trapping layer 44. Thereby, holes in the charge-storing region can be compensated. The operation of erasing is thus completed.

Figure 4C:
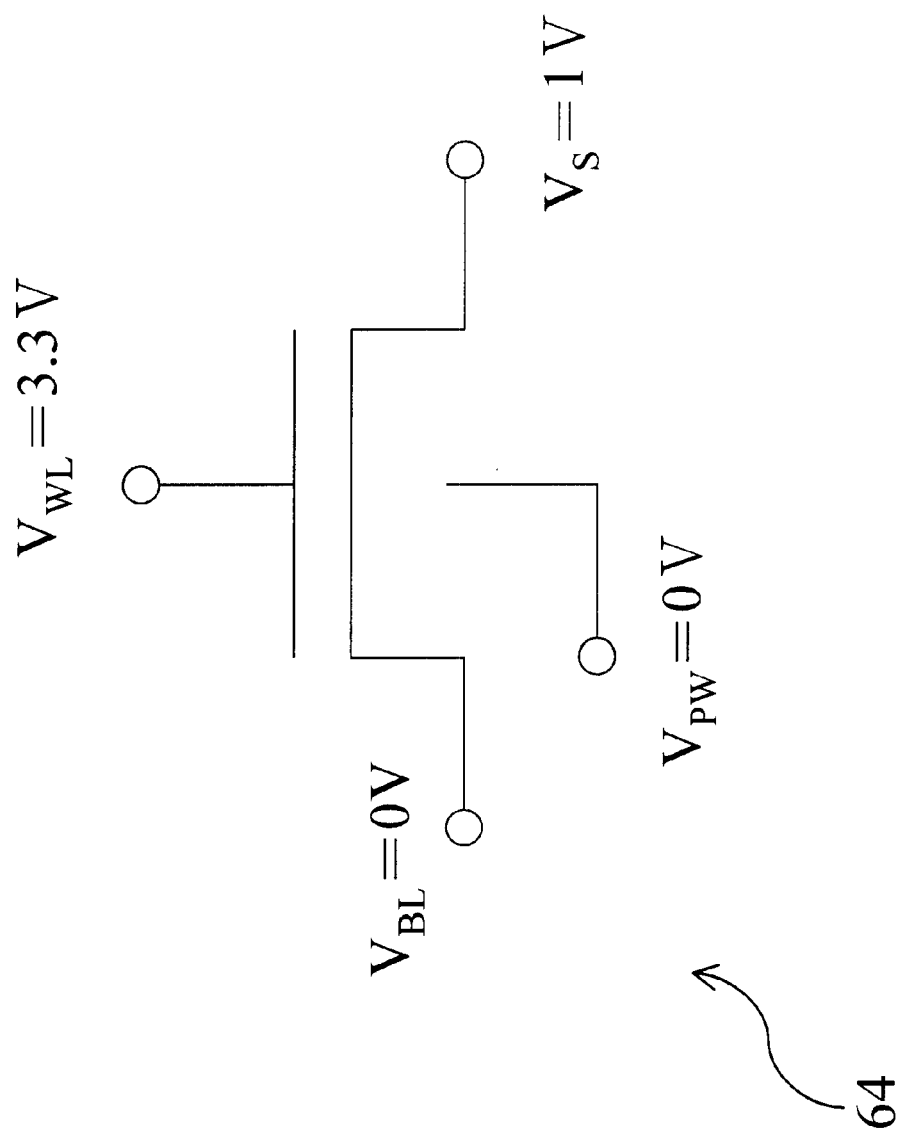

FIG. 4(C) shows a reading process of the flash memory cell 30. The word line voltage $V_{WL}$ of a positive voltage about 2~5V, e.g., $V_{WL}$=3.3V, is applied to the gate 48. The bit line voltage is a ground state ($V_{BL}$=0). The source line voltage $V_S$ is a lower positive voltage ($V_S$=1V). The voltage of the p-well $V_{PW}$ is a ground state ($V_{PW}$=0). The operation of reading to the bit of the flash memory cell 30 is thus completed.

The present invention exploits the functions of an n-type drain and another shallow doped p-well to respectively control and share the voltage so as to reduce the operational voltage of the flash memory cell. The design of peripheral circuits can also be simplified. Because short channel effects or the phenomenon of punch through will not occur in the present invention, the miniaturization of the memory cell can be enhanced so that both the effects of high density and low operational voltage can be achieved.

The present invention uses a flash memory cell having a p-type semiconductor substrate to illustrate the structure and the operational method of the present invention. The present invention can also use a flash memory cell having an n-type semiconductor substrate to achieve the same effect. In the flash memory cell having an n-type semiconductor substrate, the first deep doped-region and the first shallow doped-region are changed to be p-type doped-regions, and the second doped-region is a corresponding n-type doped-region. The other structure and the relevant positions are the same as above and thus will not be further illustrated. The operations of programming, erasing, and reading of the flash memory cell having an n-type semiconductor substrate can be accomplished by only applying voltages reverse to those of the above flash memory cell having a p-type semiconductor substrate. That is, during the operational process, positive and negative voltages applied to the flash memory cell having a p-type semiconductor substrate are respectively changed to negative and positive voltages, and original zero voltages, ground states, and floating states are kept invariant. Thereby, the operations of programming, erasing, and reading of the flash memory cell having an n-type semiconductor substrate can be accomplished through these reverse operational voltages.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. An embedded type flash memory structure, comprising:
   a semiconductor substrate;
   a first deep doped-region formed on the surface of said semiconductor substrate;
   a plurality of first shallow doped-regions formed in said first deep doped-region, wherein a first plurality of said plurality of first shallow doped-regions constitute transistor sources and a second plurality of first shallow doped-regions constitute transistor drains and wherein an ion penetration depth of said first deep doped-region is greater than that of said first shallow doped-regions;
   a plurality of second shallow doped-regions formed in said first deep doped-region wherein each of said plurality of second shallow doped-regions surrounds a corresponding one of said first shallow doped-regions, wherein said corresponding one of said first shallow doped-regions is one of said transistor drains, wherein each of said transistor sources is excluded from being surrounded by one of said plurality of second shallow doped-regions and wherein an ion penetration depth of said plurality of second shallow doped-regions is greater than that of said plurality of first shallow doped-regions and less than said penetration depth of said first deep doped-region;
   a dielectric insulating layer stacked above said first deep doped-region; and
   a poly-silicon layer constituting a gate formed on the surface of said dielectric insulating layer, wherein said gate mutually and simultaneously controls the electric field between a plurality of said transistor sources and a corresponding plurality of said transistor drains.

2. The embedded type flash memory structure as claimed in claim 1, wherein said semiconductor substrate can be a p-type semiconductor material or an n-type semiconductor material.

3. The embedded type flash memory structure as claimed in claim 1, wherein said first deep doped-region and said first shallow doped-regions are doped with first type ions, and said semiconductor substrate and said second shallow doped-regions are doped with second type ions, said first type ions being different from said second type ions.

4. The embedded type flash memory structure as claimed in claim 3, wherein said semiconductor substrate is a p-type semiconductor substrate, said first deep doped-region and said first shallow doped-regions are n-type doped-regions, and said second shallow doped-regions are corresponding p-type doped-regions.

5. The embedded type flash memory structure as claimed in claim 3, wherein said semiconductor substrate is an n-type semiconductor substrate, said first deep doped-region and said first shallow doped-regions are p-type doped-regions, and said second shallow doped-regions are corresponding n-type doped-regions.

6. The embedded type flash memory structure as claimed in claim 1, wherein said dielectric insulating layer comprises a silicon oxide layer, a trapping layer, and a silicon oxide layer respectively in ascending order.

7. The embedded type flash memory structure as claimed in claim 1, wherein said trapping layer is used as a charge-storing region for accepting and keeping charges injected thereinto.

* * * * *